United States Patent
Ling et al.

(10) Patent No.: US 10,211,868 B2
(45) Date of Patent: Feb. 19, 2019

(54) PHASE NOISE SUPPRESSION

(71) Applicant: Maxlinear, Inc., Carlsbad, CA (US)

(72) Inventors: Curtis Ling, Carlsbad, CA (US); Sheng Ye, Carlsbad, CA (US)

(73) Assignee: Maxlinear, Inc., Carlsbad, CA (US)

(*) Notice: Subject to any disclaimer, the term of this patent is extended or adjusted under 35 U.S.C. 154(b) by 223 days.

(21) Appl. No.: 14/918,793

(22) Filed: Oct. 21, 2015

(65) Prior Publication Data

US 2016/0112081 A1 Apr. 21, 2016

Related U.S. Application Data

(60) Provisional application No. 62/066,591, filed on Oct. 21, 2014.

(51) Int. Cl.
| | |
|---|---|
| *H04B 1/30* | (2006.01) |
| *H04B 1/00* | (2006.01) |
| *H03F 3/24* | (2006.01) |
| *H04B 1/04* | (2006.01) |

(52) U.S. Cl.
CPC .......... *H04B 1/30* (2013.01); *H03F 3/24* (2013.01); *H04B 1/0007* (2013.01); *H04B 2001/0408* (2013.01)

(58) Field of Classification Search
CPC combination set(s) only.
See application file for complete search history.

(56) References Cited

U.S. PATENT DOCUMENTS

| | | | | | |
|---|---|---|---|---|---|
| 3,653,047 | A | * | 3/1972 | Anthony | G01S 1/50 |
| | | | | | 342/401 |
| 4,426,735 | A | * | 1/1984 | Kasperkovitz | H03G 3/34 |
| | | | | | 455/208 |
| 2002/0196864 | A1 | * | 12/2002 | Booth | H03F 1/3294 |
| | | | | | 375/296 |
| 2005/0239428 | A1 | * | 10/2005 | Seendripu | H03D 3/009 |
| | | | | | 455/280 |

* cited by examiner

*Primary Examiner* — Wednel Cadeau
(74) *Attorney, Agent, or Firm* — McAndrews, Held & Malloy, Ltd.

(57) ABSTRACT

A transceiver comprises local oscillator circuitry, phase noise determination circuitry, mixing circuitry, and digital signal processing circuitry. The local oscillator circuitry is operable to generate a local oscillator signal. The phase noise determination circuitry is operable to introduce a frequency-dependent phase shift to the local oscillator signal to generate a phase-shifted version of the local oscillator signal. The mixing circuitry is operable to mix the local oscillator signal and the phase-shifted version of the local oscillator to generate a baseband signal having an amplitude proportional to a phase difference between the local oscillator signal and the phase-shifted version of the local oscillator signal. The digital signal processing circuitry is operable to process the baseband signal to determine a phase error of the local oscillator signal, and perform signal compensation based on the determined phase error.

20 Claims, 5 Drawing Sheets

PHASE NOISE SUPPRESSION

PRIORITY CLAIM

This application claims priority to the following application, which is hereby incorporated herein by reference: U.S. provisional patent application 62/066,591 titled "Phase Noise Suppression" filed on Oct. 21, 2014.

BACKGROUND

Limitations and disadvantages of conventional methods and systems for handling phase noise will become apparent to one of skill in the art, through comparison of such systems with some aspects of the present invention as set forth in the remainder of the present application with reference to the drawings.

BRIEF SUMMARY

Systems and methods are provided for phase noise suppression, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION

Figure 1A:
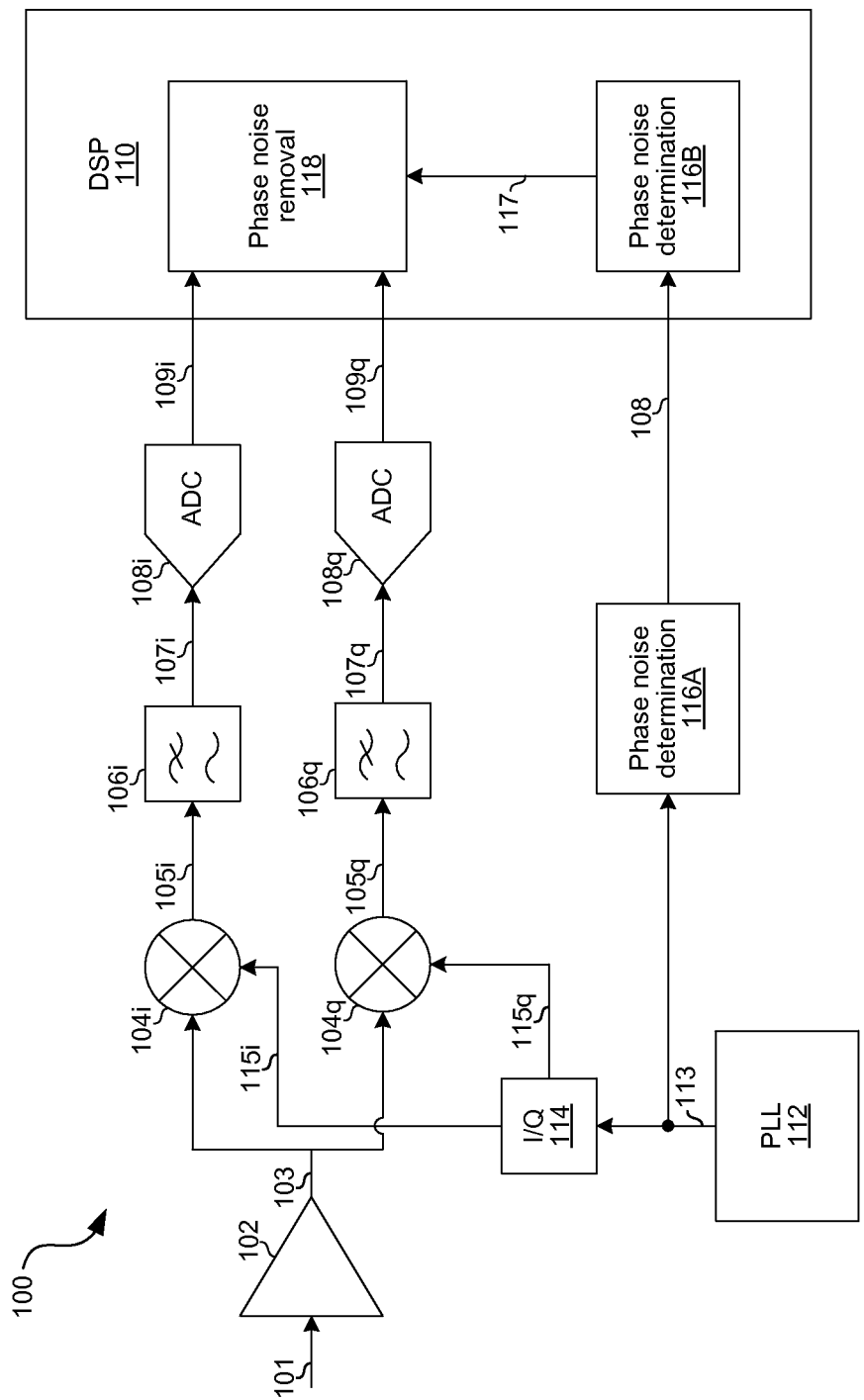
FIG. 1A is a diagram illustrating portions of an example receiver operable to suppress phase noise in accordance with aspects of this disclosure.

FIG. 1A is a diagram illustrating portions of an example receiver operable to suppress phase noise in accordance with aspects of this disclosure. The receiver 100 comprises an amplifier 102, mixers 104$i$ and 104$q$, filters 106$i$ and 106$q$, analog-to-digital converters (ADCs) 108$i$ and 108$q$, digital signal processing circuitry (110), phase locked loop (PLL) 112, phase splitter 114, phase noise determination circuitry 116 (comprising an analog portion 116A and digital portion 116B), and phase noise removal circuitry 118.

The amplifier 102 comprises circuitry operable to amplify the received signal 101 (e.g., a signal from a microwave backhaul link in the 6 to 42 GHz band) to generate the signal 103. The mixer 104$i$ comprises circuitry operable to mix the in-phase LO signal 115$i$ with the signal 103 to generate signal 105$i$, and the mixer 104$q$ comprises circuitry operable to mix the quadrature phase LO signal 115$q$ with the signal 103 to generate signal 105$q$. The filter 106$i$ comprises circuitry operable to filter out undesired frequencies from the signal 105$i$, resulting in signal 107$i$. The filter 106$q$ comprises circuitry operable to filter out undesired frequencies from the signal 105$q$, resulting in signal 107$q$. The ADC 108$i$ digitizes the signal 107$i$ to generate signal 109$i$. The ADC 108$q$ digitizes the signal 107$q$ to generate signal 109$q$.

The PLL 112 generates a local oscillator signal 113 which is split into two phases by phase splitter 114, resulting in in-phase LO signal 115$i$ and quadrature-phase LO signal 115$q$.

The phase noise determination circuitry 116 processes the LO signal 113 to determine phase noise present in the signal 113, and output an indication of this phase noise as signal 117.

The phase noise removal circuit 118 is operable to cancel/compensate phase noise introduced by the signals 115$i$ and 115$q$ based on the signal 117. Signal 117 may contain a wide range of signals including desired and undesired (blocking) signals, such as may be the case in receivers which concurrently capture and digitize an entire frequency band containing multiple channels. In such a system, removal of phase noise by block 118 allows the invention to suppress the reciprocal mixing caused by the product of blockers with the phase noise during the downconversion process.

Figure 1B:
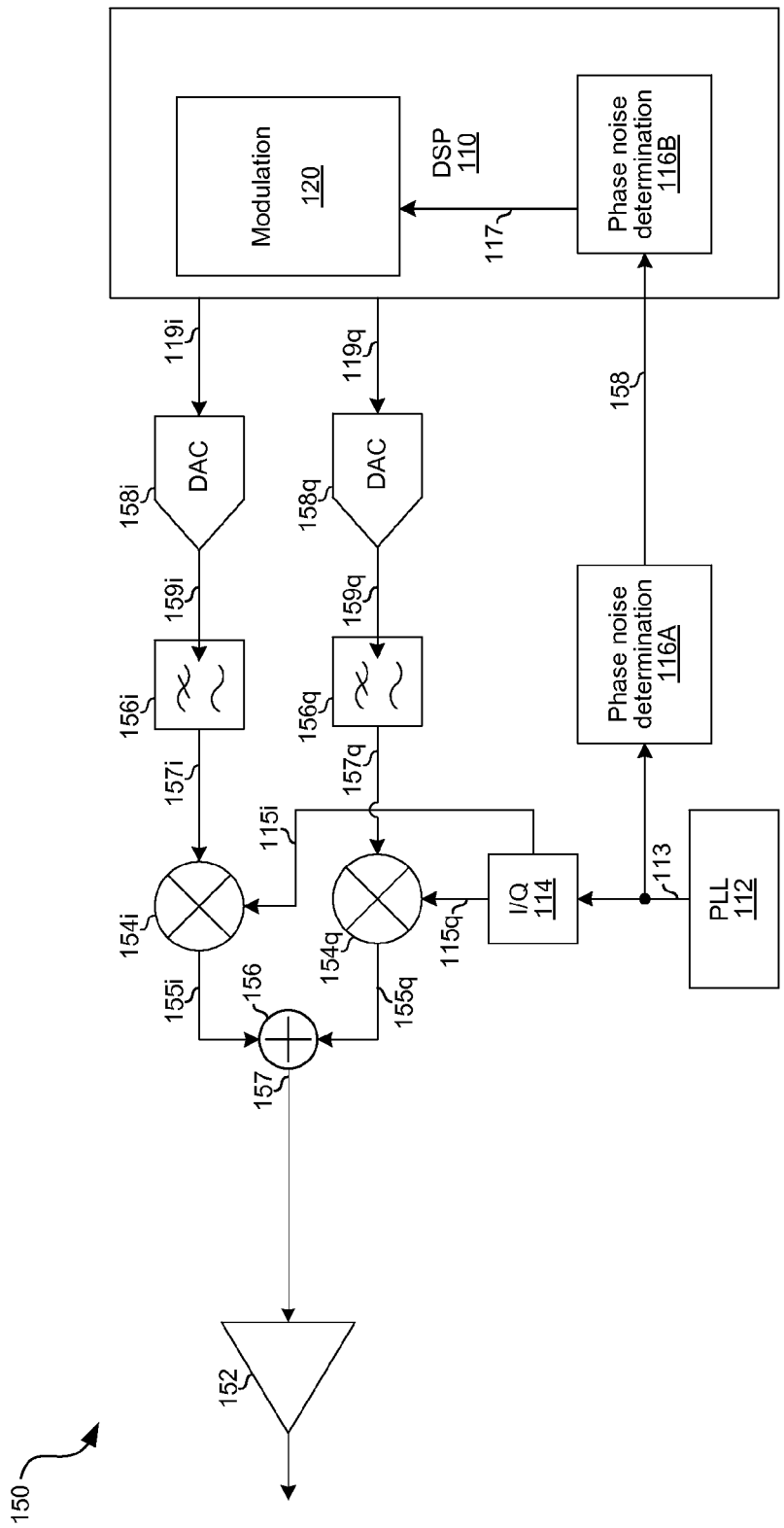
FIG. 1B is a diagram illustrating portions of an example transmitter operable to suppress phase noise in accordance with aspects of this disclosure

FIG. 1B is a diagram illustrating portions of an example transmitter operable to suppress phase noise in accordance with aspects of this disclosure. The transmitter 150 comprises digital-to-analog converters 158$i$ and 158$q$, filters 156$i$ and 156$q$, mixers 154$i$ and 154$q$, combiner 156, amplifier 152, the PLL 112, the phase splitter 114, the phase noise determination circuitry 116, and the phase noise compensation circuitry 118. The transmitter 150 may reside in the same housing and/or on the same chip as the receiver 100 and components with common reference designators may be shared between the transmitter 150 and receiver 100.

The DAC 158$i$ comprises circuitry operable to convert the signal 119$i$ to analog representation 159$i$. The DAC 158$q$ comprises circuitry operable to convert the signal 119$q$ to analog representation 159$q$. The filter 156$i$ comprises circuitry operable to filter out undesired frequencies from the signal 159$i$, resulting in signal 157$i$. The filter 156$q$ comprises circuitry operable to filter out undesired frequencies from the signal 159$q$, resulting in signal 157$q$. The mixer 154$i$ comprises circuitry operable to mix the in-phase LO signal 115$i$ with the signal 157$i$ to generate signal 155$i$, and the mixer 154$q$ comprises circuitry operable to mix the quadrature-phase LO signal 115$q$ with the signal 157$q$ to generate signal 155$q$. The combiner comprises circuitry operable to combine signals 155$i$ and 155$q$ to generate signal 157 (e.g., a microwave signal in the 6 to 42 GHz band).

The modulator circuit 120 is operable to receive the estimated phase noise 117 from 116B and cancel/compensate for phase noise in the modulated transmit waveform prior to upconversion.

The amplifier 152 comprises circuitry operable to amplify the signal 157 to generate the signal 103 for transmission onto a communication medium (e.g., onto a microwave backhaul link via one or more antennas).

The PLL 112 generates a local oscillator signal 113 which is split into two phases by phase splitter 114, resulting in in-phase LO signal 115$i$ and quadrature-phase LO signal 115$q$.

The phase noise determination circuitry 116 processes the LO signal 113 to determine phase noise present in the signal 113, and output an indication of this phase noise as signal 117.

Figure 2:
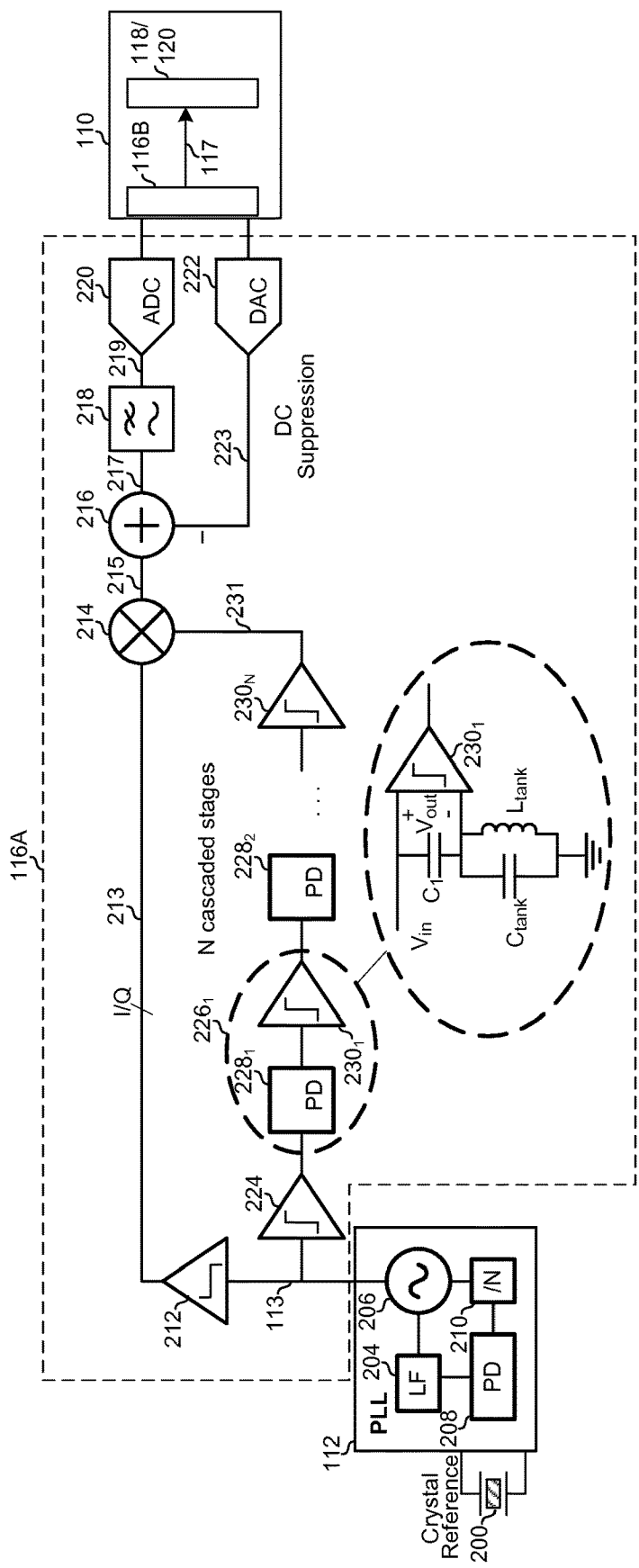
FIG. 2 is a diagram illustrating example circuitry for phase noise suppression.

FIG. 2 is a diagram illustrating example circuitry for phase noise suppression. Shown again in FIG. 2 are the PLL 112, the phase noise determination circuitry 116, and the phase noise removal circuitry 118, but with additional details of example implementations of the PLL 112 and phase noise determination circuitry 116A.

The PLL 112 uses a crystal oscillator 200 as a reference and comprises a VCO 206, frequency divider 210, phase detector 208, and loop filter 204. The PLL 112 may operate at the desired carrier frequency (e.g., 42 GHz) or may operate at some harmonic or sub-harmonic thereof, with appropriate frequency multiplication or division then performed to arrive at the desired carrier frequency.

The digital signal processing circuitry 110 comprises the portion 116B of the phase noise determination circuitry and may comprise at least a portion of the phase noise removal circuitry 118 and/or modulator 120.

The phase noise processing circuitry 116A comprises limiting amplifiers 212, 224 and $230_1$-$230_N$ (N being an integer equal to or greater than 1), phase discriminators $228_1$-$228_N$, mixer 214, combiner 216, filter 218, ADC 220, and DAC 222.

Each of the limiting amplifiers 212, 224 and $230_1$-$230_N$ comprises circuitry operable to amplify its input signal such that its output signal has a desired peak-to-peak voltage. In an example implementation the output of limiting amplifiers 212, 224 and $230_1$-$230_N$ may simply saturate to restore full swing between two voltage rails (e.g., VDD and GND). Each of the limiting amplifiers $230_1$-$230_N$ is paired with a corresponding one of the phase discriminators $228_1$-$228_N$.

Figure 3:
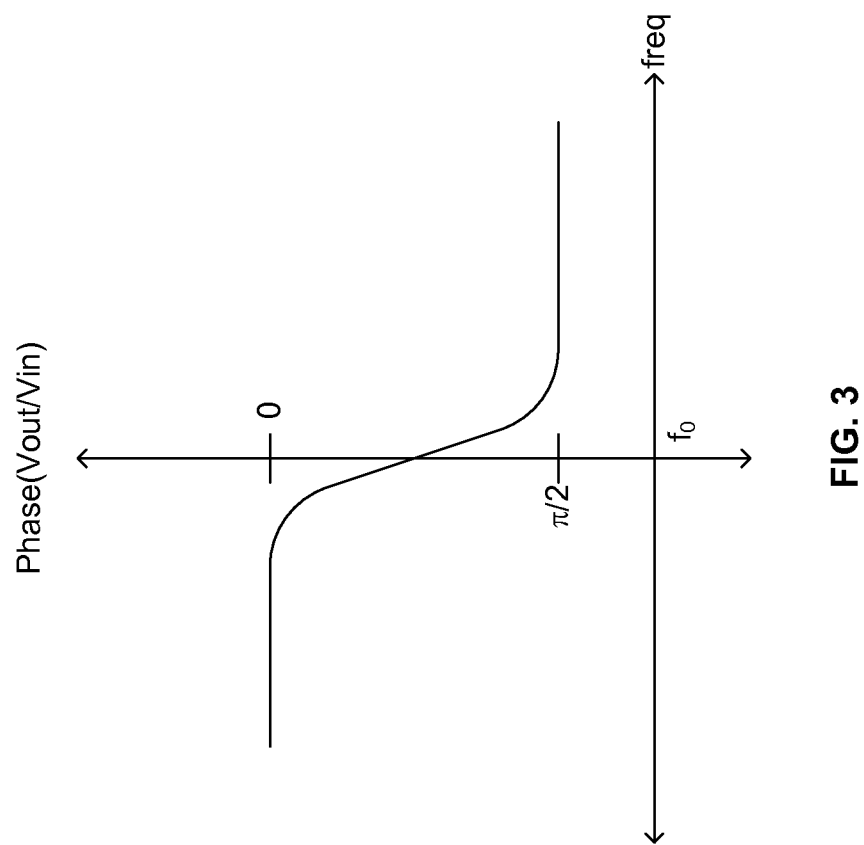
FIG. 3 depicts the phase transfer function of an example phase discriminator.

Each phase discriminator $228_n$ comprises circuitry operable to introduce a frequency-dependent phase shift. In the example implementation shown, each phase discriminator $228_n$ ($1 \leq n \leq N$) comprises a capacitor $C_1$, and a tank circuit comprising capacitor $C_{tank}$ and inductor $L_{tank}$. The phase and amplitude of the output voltage, $V_{out}$ (present across $C_1$), varies proportionally to the frequency of the input signal $V_{in}$. The amplitude variation is removed by limiting amplifier $230_n$ such that the output of stage $226_n$ is equal to the input of stage $226_n$ but with a frequency-dependent phase shift, as shown in FIG. 3. The limiter also provides isolation between stages. Cascading successive stages of phase discriminators $226_n$ increases the slope of the phase transfer function, which may make the phase error easier to detect/recover. For each phase discriminator $228_n$, the slope of the transfer function around $f_0$ depends on the quality factor (Q) of the tank formed by $C_{tank}$ and $L_{tank}$. Accordingly, one way to increase the slope is to increase the Q of the tank. This may be done by, for example, using negative resistances, n-path filter circuits, etc. Another way is to increase N (i.e., increase the number of cascaded stages). These techniques may be used in conjunction with one another. Although adding additional stages may incur a noise penalty, the noise may be relatively low, and numerous stages (e.g., up to 10 or 20 or more) may be tolerated before the additional noise becomes a limiting factor in operation of the phase noise determination circuitry 116.

Returning to FIG. 2, a result of the stages $226_1$-$226_N$ is that the phase error present in the signal 213 is phase shifted by some amount θ in the signal 231, where θ depends on its frequency offset from the center frequency of the PLL.

The mixer 214 mixes signal 213 with signal 231 to generate a baseband signal 215. Because the signal 231 is just a phase-shifted version of the signal 213, the amplitude of the signal 215 is proportional to the phase difference between signals 213 and 231.

The DC component of signal 215 is suppressed by combiner 216, resulting in signal 217. Signal 217 is then filtered by filter 218 before being converted to a digital signal by ADC 220. The signal output by ADC 220 is thus a digital baseband signal corresponding to a scaled phase difference between the signals 213 and 231. The phase noise determination circuitry 116B then compensates for the slope of the phase shift introduced by the one or more stages $226_n$, such that the original phase error present in signal 213 is recovered and output as signal 117.

Figure 4:
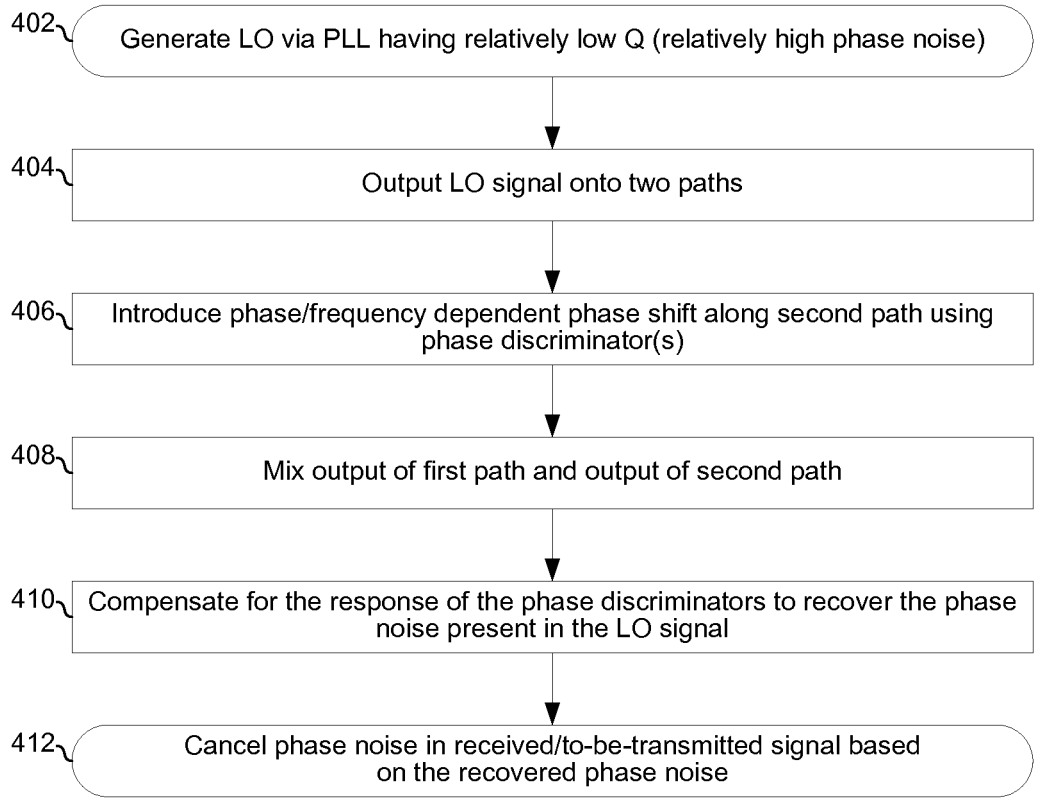
FIG. 4 is a flowchart illustrating an example process for phase noise suppression in accordance with aspects of this disclosure.

FIG. 4 is a flowchart illustrating an example process for phase noise suppression in accordance with aspects of this disclosure. In block 402, the PLL 112, having relatively low Q/high phase noise (relative to the demands of the communication system in which the PLL 112 is being used), generates LO signal 113. In block 404, the LO signal 113 is output onto two paths (e.g., the first path comprising amplifier 212 and the second path comprising amplifier 224 and stages $228_1$-$228_N$). In block 406, one or more phase discriminators (e.g., $228_1$-$228_N$) introduce a frequency-dependent phase shift to the LO signal. In block 408, the outputs of the two paths (e.g., signals 213 and 231) are mixed together (e.g., by mixer 214). In block 410, the phase determination circuitry 116B compensates for the response of the phase discriminator(s) used in block 406 to recover the original phase noise present in the LO signal. In block 412, the recovered phase noise (e.g., provided via signal 117) is used to compensate for phase noise present in a received signal or to-be-transmitted signal as a result of the noisy PLL.

In accordance with an example implementation of this disclosure, a transceiver comprises local oscillator circuitry (e.g., 112), phase noise determination circuitry (e.g., 116), mixing circuitry (e.g., 214, 216, and 218), and digital signal processing circuitry (e.g., 110). The local oscillator circuitry is operable to generate a local oscillator signal (e.g., 113). The phase noise determination circuitry is operable to introduce a frequency-dependent phase shift to the local oscillator signal to generate a phase-shifted version of the local oscillator signal (e.g., 231). The mixing circuitry operable to mix the local oscillator signal and the phase-shifted version of the local oscillator to generate a baseband signal (e.g., 219) having an amplitude proportional to a phase difference between the local oscillator signal and the phase-shifted version of the local oscillator signal. The digital signal processing circuitry is operable to process the baseband signal to determine a phase error of the local oscillator signal, and perform signal compensation based on the determined phase error. The phase noise determination circuitry may comprises a phase discriminator (e.g., $228_1$) cascaded with a limiting amplifier (e.g., $230_1$). The phase discriminator may comprise a capacitive inductive tank circuit. The phase noise determination circuitry may comprise a multi-stage phase discriminator (e.g., $226_1$-$226_N$). Each stage of the multi-stage phase discriminator may comprise a phase discriminator and a limiting amplifier. One or more limiting amplifiers may be operable to restore levels of the local oscillator signal and the phase-shifted version of the local oscillator signal prior to the mixing of the local oscillator signal and the phase-shifted version of the oscillator signal. The digital signal processing circuitry may be operable to remove the frequency-dependent phase shift from the baseband signal to determine the phase error of the local oscillator signal. The signal compensation may comprise removal of phase error from a received signal (e.g., 109i or 109q) downconverted using the local oscillator signal. The signal compensation may comprise compensation of a signal (e.g., 119I or 119Q) to be upconverted using the local oscillator signal. The system may comprise direct current (DC) suppression circuitry operable to suppress a DC component of the baseband signal.

In accordance with an example implementation of this disclosure, a transceiver comprises local oscillator circuitry (e.g., 112), analog circuitry (e.g., 116A), and digital circuitry (e.g., 110). The local oscillator circuitry is operable to generate a local oscillator signal (e.g., 113) having phase error. The analog circuitry includes one or more phase discriminators (e.g., 228) and a mixer (e.g., 214), operable to generate a signal representative of the phase error of the local oscillator signal. The digital circuitry is operable to perform signal compensation based on the signal representative of the phase error. The analog circuitry may be operable to introduce, via the one or more phase discriminators, a frequency-dependent phase shift to the local oscillator signal to generate a phase-shifted local oscillator signal (e.g., 231). The analog circuitry may be operable to mix, via the mixer, the local oscillator signal and the phase-shifted version of the local oscillator signal. The digital circuitry may be operable to compensate the signal representative of the phase error based on the frequency-dependent phase shift.

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip. Some implementations may comprise a non-transitory machine-readable (e.g., computer readable) medium (e.g., FLASH drive, optical disk, magnetic storage disk, or the like) having stored thereon one or more lines of code executable by a machine, thereby causing the machine to perform processes as described herein.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

What is claimed is:

1. A system comprising:
    local oscillator circuitry operable to generate a local oscillator signal;
    phase noise determination circuitry operable to introduce a frequency-dependent phase shift to said local oscillator signal to generate a phase-shifted version of said local oscillator signal;
    mixing circuitry operable to mix said local oscillator signal and said phase-shifted version of said local oscillator to generate a baseband signal having an amplitude proportional to a phase difference between said local oscillator signal and said phase-shifted version of said local oscillator signal; and
    digital signal processing circuitry operable to:
        process said baseband signal to determine a phase error of said local oscillator signal; and
        perform signal compensation based on said determined phase error.

2. The system of claim 1, wherein said phase noise determination circuitry comprises a phase discriminator cascaded with a limiting amplifier.

3. The system of claim 1, wherein said phase noise determination circuitry comprises a multi-stage phase discriminator.

4. The system of claim 1, comprising one or more limiting amplifiers operable to restore levels of said local oscillator signal and said phase-shifted version of said local oscillator signal prior to said mixing of said local oscillator signal and said phase-shifted version of said oscillator signal.

5. The system of claim 1, wherein said digital signal processing circuitry is operable to remove said frequency-dependent phase shift from said baseband signal to determine said phase error of said local oscillator signal.

6. The system of claim 1, wherein said signal compensation comprises removal of phase error from a received signal downconverted using said local oscillator signal.

7. The system of claim 1, wherein said signal compensation comprises compensation of a signal to be upconverted using said local oscillator signal.

8. The system of claim 1, comprising direct current (DC) suppression circuitry operable to suppress a DC component of said baseband signal.

9. The system of claim 2, wherein said phase discriminator comprises a capacitive inductive tank circuit.

10. The system of claim 3, wherein each stage of said multi-stage phase discriminator comprises a phase discriminator and a limiting amplifier.

11. A method comprising:
    generating, by local oscillator circuitry, a local oscillator signal;

introducing, by phase noise determination circuitry, a frequency-dependent phase shift to said local oscillator signal to generate a phase-shifted version of said local oscillator signal;

mixing, by mixing circuitry, said local oscillator signal and said phase-shifted version of said local oscillator to generate a baseband signal having an amplitude proportional to a phase difference between said local oscillator signal and said phase-shifted version of said local oscillator signal;

processing, by digital signal processing circuitry, said baseband signal to determine a phase error of said local oscillator signal; and performing, by said digital signal processing circuitry, signal compensation based on said determined phase error.

12. The method of claim 11, comprising restoring, by one or more limiting amplifiers, levels of said local oscillator signal and said phase-shifted version of said local oscillator signal prior to said mixing said local oscillator signal and said phase-shifted version of said oscillator signal.

13. The method of claim 11, comprising removing, by said digital signal processing circuitry, said frequency-dependent phase shift from said baseband signal to determine said phase error of said local oscillator signal.

14. The method of claim 11, comprising:
downconverting a received signal using said local oscillator signal; and
removing phase error from said downconverted received signal based on said determined phase error.

15. The method of claim 11, comprising:
compensating a signal to be transmitted based on said determined phase error; and
upconverting said compensated signal to be transmitted using said local oscillator signal.

16. The method of claim 11, comprising generating, by said digital signal processing circuitry, a direct current (DC) suppression signal for suppressing a DC component of said baseband signal.

17. A system comprising:
local oscillator circuitry operable to generate a local oscillator signal having phase error;
analog circuitry, including one or more phase discriminators and a mixer, operable to generate a signal representative of said phase error; and
digital circuitry operable to perform signal compensation based on said signal representative of said phase error.

18. The system of claim 17, wherein said analog circuitry is operable to introduce, via said one or more phase discriminators, a frequency-dependent phase shift to said local oscillator signal to generate a phase-shifted local oscillator signal.

19. The system of claim 17, wherein said digital circuitry is operable to compensate said signal representative of said phase error based on said frequency-dependent phase shift.

20. The system of claim 18, wherein said analog circuitry is operable to mix, via said mixer, said local oscillator signal and said phase-shifted version of said local oscillator signal.

* * * * *